US012754263B2

(12) United States Patent
Biber

(10) Patent No.: US 12,754,263 B2
(45) Date of Patent: Oct. 6, 2026

(54) COOLING APPARATUS FOR A CONTROL UNIT OF A MAGNETIC RESONANCE DEVICE

(71) Applicant: Siemens Healthineers AG, Forchheim (DE)

(72) Inventor: Stephan Biber, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 148 days.

(21) Appl. No.: 18/740,821

(22) Filed: Jun. 12, 2024

(65) Prior Publication Data

US 2024/0418808 A1 Dec. 19, 2024

(30) Foreign Application Priority Data

Jun. 15, 2023 (DE) ..................... 10 2023 205 590.2

(51) Int. Cl.
*G01V 3/00* (2006.01)
*G01R 33/34* (2006.01)
*H05K 7/20* (2006.01)

(52) U.S. Cl.
CPC ..... *G01R 33/3403* (2013.01); *H05K 7/20145* (2013.01); *H05K 7/20172* (2013.01)

(58) Field of Classification Search
CPC ........... G01R 33/3403; H05K 7/20145; H05K 7/20172
USPC .......................................................... 324/322
See application file for complete search history.

(56) References Cited

U.S. PATENT DOCUMENTS

2013/0301218 A1 11/2013 Li et al.
2020/0100742 A1* 4/2020 Mueller ............... A61B 6/4405
2021/0034101 A1* 2/2021 Yildiz ..................... G06F 1/203

FOREIGN PATENT DOCUMENTS

CN 2345237 Y * 10/1999
DE 202015008684 U1 2/2016
DE 102007033548 B4 * 3/2021 ........... F25D 17/067
JP S6293670 U * 6/1987

* cited by examiner

*Primary Examiner* — Walter L Lindsay, Jr.
*Assistant Examiner* — Frederick Wenderoth
(74) *Attorney, Agent, or Firm* — Banner & Witcoff, Ltd.

(57) ABSTRACT

The disclosure relates to a cooling apparatus with a control unit for a detector unit included in a magnetic resonance device. The control unit comprises at least two electronic components that generate waste heat during operation of the magnetic resonance device. The control unit is to be arranged on a surface of the detector unit, and comprises an active cooling unit comprising at least one piezoelectric fan, which is embodied to generate an airflow on a surface of the control unit and/or on a surface of at least one electronic component of the at least two electronic components.

20 Claims, 6 Drawing Sheets

COOLING APPARATUS FOR A CONTROL UNIT OF A MAGNETIC RESONANCE DEVICE

CROSS-REFERENCE TO RELATED APPLICATIONS

The present application claims priority to and the benefit of German patent application no. DE 10 2023 205 590.2, filed on Jun. 15, 2023, the contents of which are incorporated herein by reference in their entirety.

TECHNICAL FIELD

The disclosure relates to a cooling apparatus with a control unit for a detector unit of a magnetic resonance device, and a magnetic resonance device.

BACKGROUND

In a magnetic resonance device, a main magnet is normally used to apply a relatively high main magnetic field, for example of 1.5 or 3 or 7 Tesla, to the body to be examined of an object under examination, in particular of a patient. In addition, gradient pulses are output with the aid of a gradient coil unit. Radio-frequency pulses (RF pulses), in particular excitation pulses, are then emitted by way of a radio-frequency antenna unit using suitable antenna facilities. This results in the nuclear spins of particular atoms being excited into resonance by these RF pulses being tilted through a defined flip angle relative to the magnetic field lines of the main magnetic field. On relaxation of the nuclear spins, radio-frequency signals, so-called magnetic resonance signals are emitted and are received by means of suitable radio-frequency antennas, which are then further processed. From the raw data acquired in this way, the desired image data can finally be reconstructed.

For the operation of a magnetic resonance device, the radio-frequency antenna unit and in particular the gradient coil unit are controlled by means of an electric current. Currents are routed into the gradient coils of the gradient coil unit to generate gradient pulses, the amplitudes of which reach several hundred amps and the changes in current direction are subject to rise and fall rates of several hundred kA/s. The radio-frequency antenna unit is driven with a lower electrical power than the gradient coil unit. The energy sources and amplifier units for the gradient coil unit and the radio-frequency antenna unit are typically arranged spatially separated from the detector unit of the magnetic resonance device, as well as the main control unit of the magnetic resonance device, which performs the central control and coordination of the individual components.

Magnetic resonance devices also require a control unit in the immediate vicinity of the detector unit, which implements the control centrally coordinated by the main control unit and/or controls individually interconnected subcomponents of individual components accordingly. Accordingly, such a control unit comprises control electronics, in particular electronic components, e.g. designed for the control of various coil elements included in a transmitter coil by means of a wiring matrix, the coordination of received MR signals from different receive coil elements, the digitization of electrical signals, the consolidation of sensor data, in particular temperature sensor data, the control of the patient positioning apparatus, etc.

An electronic component typically comprises a printed circuit board. The control unit, in particular the electronic components, is typically positioned on an outer housing of the detector unit and/or the main magnets. This reduces the number of individual supply cables between the main control unit and the components of the magnetic resonance device and allows the power to be provided to the control unit, data to be exchanged optically, for example between the main control unit and the control unit, and only a small amount of electrical signals to be exchanged.

Such electronic components typically have an electrical power of less than 2 kW. The power requirement of such electronic components is typically between 50 W and 500 W. In addition, such electronic components typically generate waste heat of less than 1000 W, e.g. less than 500 W, during operation of the magnetic resonance device. The compact design of magnetic resonance devices results in little freely available space and a high integration density of the electronic components, in particular the printed circuit boards. Due to the positioning of the control unit comprising such electronic components in the vicinity of the detector unit, in particular in the vicinity of the main magnet, cooling of the control unit is required.

SUMMARY

An object underlying the disclosure is to specify an improved cooling system for a control unit of a detector unit of a magnetic resonance device, which is embodied to cool parts of the control unit that heat up during the operation of the magnetic resonance device in a particularly efficient manner. The object is achieved by the various embodiments as described herein, including the drawings and claims.

The cooling apparatus according to the disclosure comprises a control unit for a detector unit, which is included in a magnetic resonance device.

The control unit comprises at least two electronic components that generate waste heat during operation of the magnetic resonance device, e.g. the detector unit, and the control unit is to be arranged on a surface of the detector unit and/or may be arranged on the surface of the detector unit and/or permanently or reversibly connected to the surface of the detector unit.

The cooling apparatus comprises an active cooling unit comprising at least one piezoelectric fan, which is embodied to generate an airflow on a surface of the control unit and/or on a surface of at least one electronic component of the at least two electronic components.

The detector unit typically comprises at least a main magnet, a gradient coil unit, and a radio-frequency (RF) antenna unit. The detector unit is typically surrounded by a housing unit. The detector unit can comprise the housing unit. The housing unit typically closes the detector unit to the outside, e.g. also towards the patient receiving area, which is typically cylindrically surrounded by the detector unit. The housing unit defines a surface and/or has a surface facing away from the detector unit, which can be referred to as the surface of the detector unit.

The control unit can be arranged on the surface of the detector unit. For this purpose, the control unit and/or the surface of the detector unit, e.g. the housing unit, may have fixing apparatuses so that the control unit can be attached to the detector unit in a reversibly releasable manner. The detector unit can be permanently connected to the detector unit, e.g. to the surface of the detector unit. A control unit arranged on the surface of the detector unit has a point of contact and/or a contact surface with the detector unit.

A piezoelectric fan typically comprises a blower-like structure, e.g. a blower, and a piezo unit which is connected to the blower-like structure. The application of an electrical signal to the piezo unit typically induces a movement of the blower-like structure. The movement of the blower-like structure is embodied to generate an airflow. The active cooling unit may comprise any suitable number (e.g. at least two, at least four, at least six, etc.) piezoelectric fans.

The active cooling unit, e.g. the at least one piezoelectric fan, may be integrated into and/or arranged on the control unit in such a way that an airflow generated by the piezoelectric fan flows around at least one electronic component. In an embodiment, the control unit is free of a closed surface and may for instance comprise openings and/or slots. This allows for an airflow around individual electronic components included in the control unit.

The airflow generated by the active cooling unit allows for convection of the waste heat, e.g. a flow transport of the waste heat of the electronic components away from the electronic components. This leads to an active cooling of the electronic components.

Piezoelectric fans are typically robust, typically have a long shelf life and at the same time low energy requirements. In addition, piezoelectric fans have a robust and reliable functionality independent of a magnetic field, e.g. the main magnetic field and/or a stray magnetic field. The cooling unit is therefore designed in such a way that the control unit included in the cooling unit can be reliably cooled. In addition, it is possible to dispense with a cooling medium, such as water, for instance, which makes the use of the cooling unit easy and flexible.

One embodiment of the cooling apparatus provides that the control unit is designed in such a way that two electronic components of at least two electronic components are arranged next to each other and spaced apart from each other by a gap, and the active cooling unit is embodied to generate an airflow through the gap.

The at least two electronic components may for instance be arranged parallel to one another. In an embodiment, all the electronic components included in the control unit are arranged next to each other, wherein two electronic components are spaced apart from each other by a gap in each case. Apart from the electronic components arranged at the edge of the control unit, each electronic component has two adjacent electronic components, wherein the adjacent electronic components are arranged spaced apart herefrom by a gap in each case. An electronic component typically has a two-dimensional shape. An electronic component typically has a shape of a cuboid or an envelope in the form of a cuboid, wherein when the control unit is arranged on the detector unit, a first edge of the cuboid may e.g. be arranged parallel to the x-axis, a second edge of the cuboid parallel to the y-axis, and a third edge of the cuboid parallel to the z-axis.

The cuboid may have e.g. three edge lengths, wherein a third edge length of the three edge lengths of the cuboid, e.g. the height of the cuboid, may have any suitable maximum dimension with respect to a proportion of a first edge length of the three edge lengths and/or a second edge length of the three edge lengths such as for instance a maximum of 30%, 20%, 15%, etc., of such edge lengths. The third edge length may e.g. correspond to the length of the third edge. A straight line parallel to the third edge length may e.g. be embodied perpendicular to the gap and/or corresponds to a solder connection between two adjacent electronic components. The gap may e.g. be an opening and/or an air-filled space and/or a free space between two adjacent electronic components. The generation of an airflow through the gap enables particularly efficient cooling of the two electronic components forming the gap.

An embodiment of the cooling apparatus provides that the active cooling unit comprises at least two piezoelectric fans, which are embodied to generate an airflow through the gap, and is designed in such a way that the at least two piezoelectric fans are arranged at an opening in the gap at equal distances from at least one electronic component of the electronic components spaced apart from one another by the gap and when the cooling device is arranged on the surface of the detector unit, the at least two piezoelectric fans have a different distance from the surface of the detector unit.

This embodiment therefore provides that at least two piezoelectric fans are arranged in such a way that they generate an airflow within a gap. For this purpose, the at least two piezoelectric fans may e.g. be arranged next to each other in such a way that at most one piezoelectric fan of the at least two piezoelectric fans is arranged on a solder connection between two adjacent electronic components. The at least two piezoelectric fans may e.g. be arranged along a straight line parallel to the adjacent electronic components. The opening of the gap typically corresponds to one end, e.g. the top end or the bottom end of the gap. The opening of the gap can also correspond to the extension of the gap beyond the two electronic components.

The gap may e.g. be parallel to a plane, which plane is arranged perpendicular to the surface of the detector unit when the cooling apparatus is arranged on the surface of the detector unit. This embodiment therefore provides that the at least two piezoelectric fans are arranged one above the other with a projection view of the gap perpendicular to the surface of the detector unit. This embodiment therefore provides that the at least two piezoelectric fans are arranged next to each other with a projection view of the gap parallel to the surface of the detector unit. This arrangement of the at least two piezoelectric fans enables a particularly strong and wide airflow within the gap and thus a particularly uniform cooling of the two electronic components adjacent to the gap.

An embodiment of the cooling apparatus provides that the active cooling unit comprises at least two piezoelectric fans embodied to generate an airflow through the gap and is designed in such a way that the at least two piezoelectric fans are arranged at an opening of the gap with different distances from at least one electronic component of the electronic components spaced apart from one another by the gap, in each case, and when the cooling apparatus is arranged on the surface of the detector unit, the at least two piezoelectric fans have an identical distance from the surface of the detector unit.

This embodiment therefore provides that at least two piezoelectric fans are arranged in such a way that they generate an airflow within a gap. For this purpose, the at least two piezoelectric fans may e.g. be arranged next to each other in such a way that at least two of the at least two piezoelectric fans are arranged on a solder connection between two adjacent electronic components. This embodiment therefore provides that the at least two piezoelectric fans are arranged next to each another with a projection view of the gap perpendicular to the surface of the detector unit. This embodiment therefore provides that the at least two piezoelectric fans are arranged one above the other with a projection view of the gap parallel to the surface of the detector unit. This arrangement of the at least two piezoelectric fans enables a particularly rapid airflow within the gap and thus a particularly uniform cooling of the two electronic components adjacent to the gap.

One embodiment of the cooling apparatus provides that the control unit is embodied in such a way that when the control unit is arranged on the surface of the detector unit, a longitudinal side of at least one electronic component and the gap run predominantly vertically.

An electronic component may e.g. have a shape of a cuboid or an envelope in the form of a cuboid, wherein when the control unit is arranged on the detector unit, a first edge of the cuboid may e.g. be arranged parallel to the x-axis, a second edge of the cuboid parallel to the y-axis, and a third edge of the cuboid parallel to the z-axis. The third edge may correspond to the height of the electronic component and has the shortest length of the three edges. The longitudinal side of an electronic component may e.g. be defined by a plane comprising the first edge and the second edge. The longitudinal side may e.g. correspond to the largest flat surface area of the surface of the electronic component. An arrangement and/or a design of the control unit according to this embodiment enables a particularly efficient removal of the waste heat produced by the electronic components during the operation of the magnetic resonance device, as the natural upward convection of heat supports the cooling process. As a result, the active cooling unit can generate an airflow particularly efficiently.

An alternative embodiment provides for an arrangement of the control unit on the surface of the detector unit in such a way that a longitudinal side of at least one electronic component and the gap run predominantly horizontally. This enables a flexible arrangement of the control unit.

One embodiment of the cooling apparatus provides that the piezoelectric fan is arranged in a vertical direction below the gap and a blower included in the piezoelectric fan faces the at least two electronic components. The piezoelectric fan, for example the blower, may be embodied to generate an airflow in a vertical direction upwards through the gap. Supported by the natural upward convection of the waste heat, this embodiment enables a particularly efficient cooling of at least two electronic components.

One embodiment of the cooling apparatus provides that the piezoelectric fan is arranged in the vertical direction above the gap and a blower included in the piezoelectric fan faces away from the at least two electronic components. The piezoelectric fan, e.g. the blower, may be embodied to upwardly attract and discharge air present within the gap, as a result of which an airflow is generated within the gap. Supported by the natural upward convection of the waste heat, this embodiment enables a particularly efficient cooling of at least two electronic components and a flexible use of the active cooling unit.

An embodiment of the cooling apparatus provides that the active cooling unit comprises an air deflection apparatus, the piezoelectric fan is arranged in a horizontal direction, and the air deflection apparatus is embodied to introduce and/or discharge the airflow in the vertical direction into and/or away from the gap.

The piezoelectric fan, and for example a blower included in the fan, may be arranged horizontally. The piezoelectric fan can be arranged above or below the gap. The air deflection apparatus can include a metal sheet bent by 90°. This embodiment enables a low installation height of the active cooling unit, so that a compact design and efficient cooling can be achieved despite the long blowers included in the piezoelectric fan.

One embodiment of the cooling apparatus provides that the two electronic components each have a heat surface and are arranged in such a way that exactly one heat surface faces the gap, and the piezoelectric fan is embodied to generate the airflow through the gap.

The two electronic components may e.g. be designed as surface elements. Each of the two electronic components may have exactly one heat surface in each case. A heat surface of an electronic component typically corresponds to the part of the surface of the electronic component over which the largest proportion of waste heat can be output. An electronic component typically has two longitudinal sides. One longitudinal side of the electronic component can be embodied as a heat surface. The two electronic components may for instance be arranged in such a way that exactly one heat surface of an electronic component of the two electronic components faces the gap. The two electronic components are preferably arranged in such a way that exactly one heat surface of an electronic component of the two electronic components faces away from the gap. In an embodiment, at least one piezoelectric fan is embodied to generate the airflow through the gap. This embodiment allows only one electronic component of the two electronic components to dissipate waste heat into the gap above its heat surface and thus enables uniform and efficient cooling of all electronic components included in the control unit.

One embodiment of the cooling apparatus provides that the two electronic components each have a heat surface and are arranged in such a way that the two heat surfaces face the gap, and the piezoelectric fan is embodied to generate the airflow through the gap. According to this embodiment, two heat surfaces of two electronic components face a gap. This enables a particularly efficient cooling, even with a reduced number of piezoelectric fans.

An embodiment of the cooling apparatus provides that the control unit comprises at least four electronic components and at least three gaps, in each case two of the at least four electronic components are arranged next to each other and spaced apart from one another by a gap of the three gaps in each case, the active cooling unit is embodied to generate an airflow through at least one gap of the three gaps, and the at least four electronic components have a heat surface in each case and are arranged in such a way that at least one gap of the three gaps is free of a facing heat surface and the gap is free of a piezoelectric fan assigned to the gap. According to this embodiment, the heat surfaces are concentrated abutting against a first gap, whereas a second gap is free of abutting heat surfaces. This makes it possible to largely dispense with an airflow within the second gap. For example, it is possible to dispense with an explicit assignment of a piezoelectric fan for the second gap. Active cooling of the first gap of two heat surfaces by means of the active cooling unit can be designed particularly efficiently.

An embodiment of the cooling apparatus provides that the at least two electronic components are each embodied as surface elements, which surface elements are arranged parallel to each other and spaced apart from one another by a gap, and the control unit is to be arranged on the surface of the detector unit in such a way that the flat surface areas of the surface elements are arranged perpendicular to the surface of the detector unit. A surface element may e.g. have a shape of a cuboid or an envelope in the form of a cuboid, wherein the cuboid has a particularly small spatial extension in one of the three spatial directions. The two other spatial directions of the three spatial directions may e.g. define a plane to which plane two longitudinal sides of the surface elements are parallel. All electronic components may be arranged parallel to each other and two adjacent electronic components are separated from each other by a gap in each case. This embodiment allows for a particularly compact design of the control unit and thus also a compact design of the cooling apparatus.

An embodiment of the cooling apparatus additionally comprises a passive cooling unit comprising a heat sink arranged on a surface of an electronic component. The passive cooling unit may comprise two or more heat sinks, wherein at least one heat sink is arranged on a surface of an electronic component in each case. In an embodiment, at least one heat sink is arranged on each electronic component. It is also conceivable that an electronic component of the at least two electronic components is free of a heat sink. This embodiment thus provides for a combination of an active cooling unit and a passive cooling unit, as a result of which the radiation and convection of the waste heat is supported particularly efficiently.

One embodiment of the cooling apparatus provides that the heat sink has several fins parallel to each other in the form of elevations perpendicular to the surface of the electronic component, and the active cooling unit is embodied to generate an airflow along the fins. Fins increase e.g. the surface and thus improve the possibility of dissipating waste heat into the environment, as a result of which the passive cooling is improved. The heat sinks, for example the fins, may have a vertical orientation. As a result, the fins of the heat sinks can support convection particularly well.

Furthermore, the disclosure is based on a magnetic resonance device comprising a detector unit and a cooling apparatus with a control unit for the detector unit, wherein the cooling apparatus with the control unit is arranged on the surface of the detector unit. The detector unit typically comprises a main magnet, a gradient coil unit, and a radio-frequency antenna unit. The detector unit can also comprise a local coil unit, which is embodied to capture MR signals and is embodied as a radio-frequency antenna.

Embodiments of the magnetic resonance device are designed similarly to the embodiments of the cooling apparatus. The advantages of the magnetic resonance device according to the disclosure essentially correspond to the advantages of the cooling apparatus according to the disclosure, which are described in detail in advance. Features, advantages, or alternative embodiments mentioned herein can also be transferred to the other claimed subject-matter, and vice versa.

BRIEF DESCRIPTION OF THE DRAWINGS

Further advantages, features and details of the disclosure can be found in the exemplary embodiments described below as well as in the drawings.

In the drawings.

DETAILED DESCRIPTION OF THE DISCLOSURE

Figure 1:
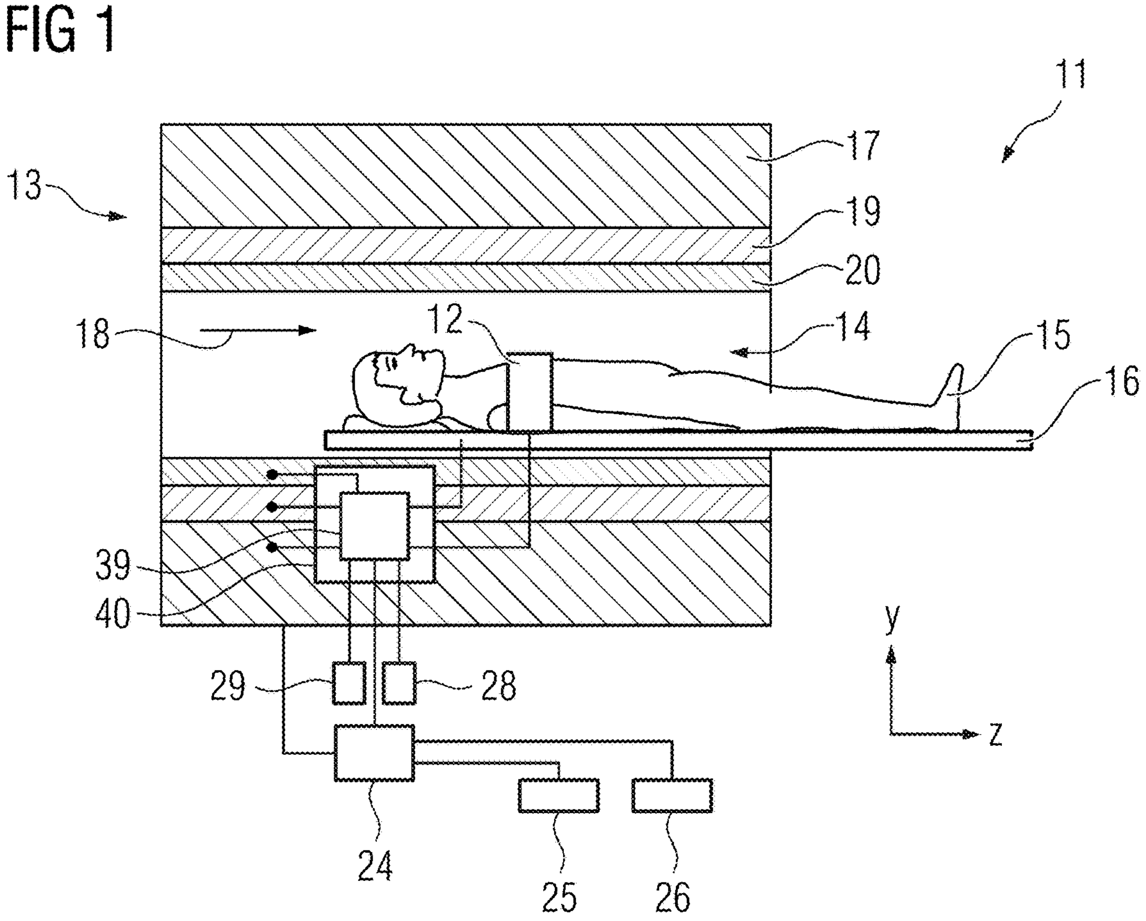
FIG. 1 illustrates an example magnetic resonance device in a schematic representation in a first view according to the disclosure.

FIG. 1 illustrates a magnetic resonance device 11 in a schematic representation in a first view according to the disclosure. The magnetic resonance device 11 comprises a detector unit 13 and has a cylindrical patient receiving area 14 for receiving a patient 15, wherein the patient receiving area 14 is cylindrically enclosed in a circumferential direction by the detector unit 13. The patient 15 can be pushed into the patient receiving area 14 by means of a patient positioning apparatus 16 of the magnetic resonance device 11.

The detector unit 13 comprises a main magnet 17 to generate a strong and constant main magnetic field 18 within the patient receiving area 14. The detector unit 13 also has a gradient coil unit 19, which is used for spatial encoding during imaging. The gradient coil unit 19 is controlled by means of a gradient control unit 28. Furthermore, the magnet unit 13 has a radio-frequency antenna unit 20 for emitting RF pulses, which, in the case shown, is embodied as a body coil permanently integrated into the magnetic resonance device 11, and a radio-frequency antenna control unit 29 for an excitation of a polarization that occurs in the main magnetic field 18 generated by the main magnet 17. The radio-frequency antenna unit 20 is controlled by the radio-frequency antenna control unit 29 and radiates radio-frequency pulses into an examination space, which is substantially formed by the patient receiving area 14. To receive MR signals, the magnetic resonance device 11 has a local coil unit 12, which is embodied as an antenna unit for receiving radio frequency signals and is positioned in the vicinity of the examination area of the patient 15, such as in the vicinity of the surface of the patient's body.

The magnetic resonance device 11 has a main control unit 24 for controlling the main magnet 17, the gradient control unit 28, and the radio-frequency antenna control unit 29. The main control unit 24 centrally controls the magnetic resonance device 11, such as for example the execution of MR control sequences. In addition, the main control unit 24 comprises a reconstruction unit (not disclosed in more detail) for reconstructing medical image data that is captured during the magnetic resonance examination. The magnetic resonance device 11 has a display unit 25. Control information such as, for example, control parameters and reconstructed image data, can be displayed on the display unit 25, for example on at least one monitor, for a user. In addition, the magnetic resonance device 11 has an input unit 26, by means of which information and/or control parameters can be input by a user during a measuring procedure. The main control unit 24 can comprise the gradient control unit 28 and/or radio-frequency antenna control unit 29 and/or the display unit 25 and/or the input unit 26.

The magnetic resonance device also has a cooling apparatus 40 with a control unit 39 for the detector unit 13. The cooling apparatus 40 is arranged on the surface of the detector unit 13. The control unit 39 may e.g. have electrical connections to the local coil unit 12 and/or to the patient positioning apparatus 16 and/or to the radio-frequency antenna unit 20 and/or to the main magnet 17 and/or to the gradient coil unit 19 and/or to other components of the magnetic resonance device that are not shown in more detail. The control unit 39 may for instance have electronic components for the realization of control information specified by the main control unit 24 and/or gradient control unit 28 and/or radio-frequency antenna control unit 29 and/or is embodied to control the local coil unit 12 and/or the patient positioning apparatus 16 and/or the radio-frequency antenna unit 20 and/or the main magnet 17 and/or the gradient coil unit 19 according to the control information and/or receive and/or process information from the same components of the detector unit 13 and/or the magnetic resonance device 11. These electronic components generate waste heat during the operation of the magnetic resonance device, wherein an active cooling unit 41, which is not shown in more detail by the cooling apparatus 40 in FIG. 1, is embodied to generate an airflow.

The control unit 39 can comprise the gradient control unit 28 and/or the radio-frequency antenna control unit 29. The control unit 39 is typically embodied separately from the main control unit 24. The main control unit 24 may for example be arranged outside of an RF-shielded room surrounding the detector unit 13. The control unit 39 may for example be arranged inside of the RF-shielded room surrounding the detector unit 13.

The magnetic resonance device 11 shown can naturally comprise further or alternate components that magnetic resonance devices 11 typically have. A general functionality of a magnetic resonance device 11 is also known to the person skilled in the art, so that a detailed description of the further components is omitted.

Figure 2:
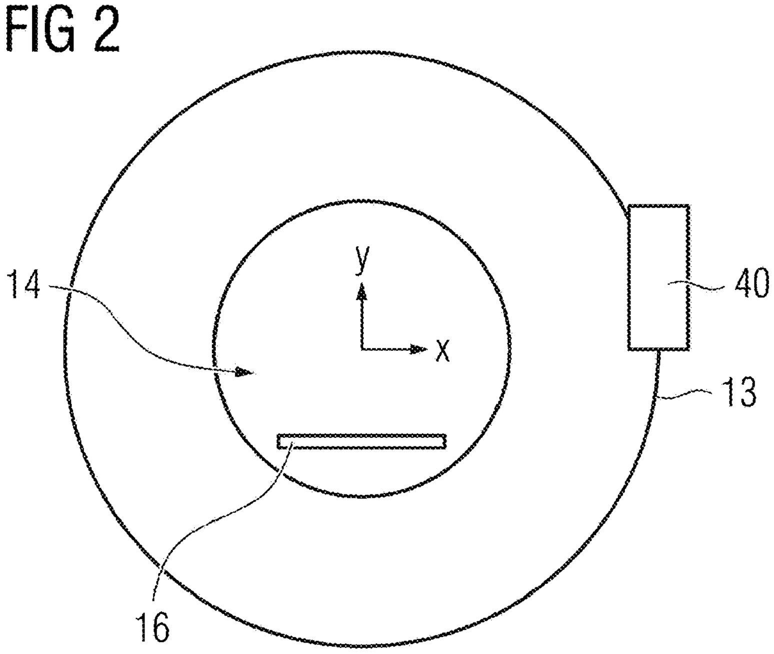
FIG. 2 illustrates an example magnetic resonance device in a schematic representation in a second view according to the disclosure.

FIG. 2 illustrates the magnetic resonance device 11 in a schematic representation in a second view according to the disclosure. The second view is perpendicular to the first view as shown in FIG. 1, and represents the arrangement of the cooling apparatus 40 on the surface of the detector unit 13. The embodiment of the magnetic resonance device 11 as shown in FIG. 2 differs from the embodiment shown in FIG. 1 in that the cooling apparatus 40 is arranged largely centrally on the side and not on the side of the lower half of the detector unit 13, as shown in FIG. 1. In either case, this is by way of example and not limitation, and the cooling apparatus 40 may be arranged at any suitable location of the detector unit 13.

Figure 3:
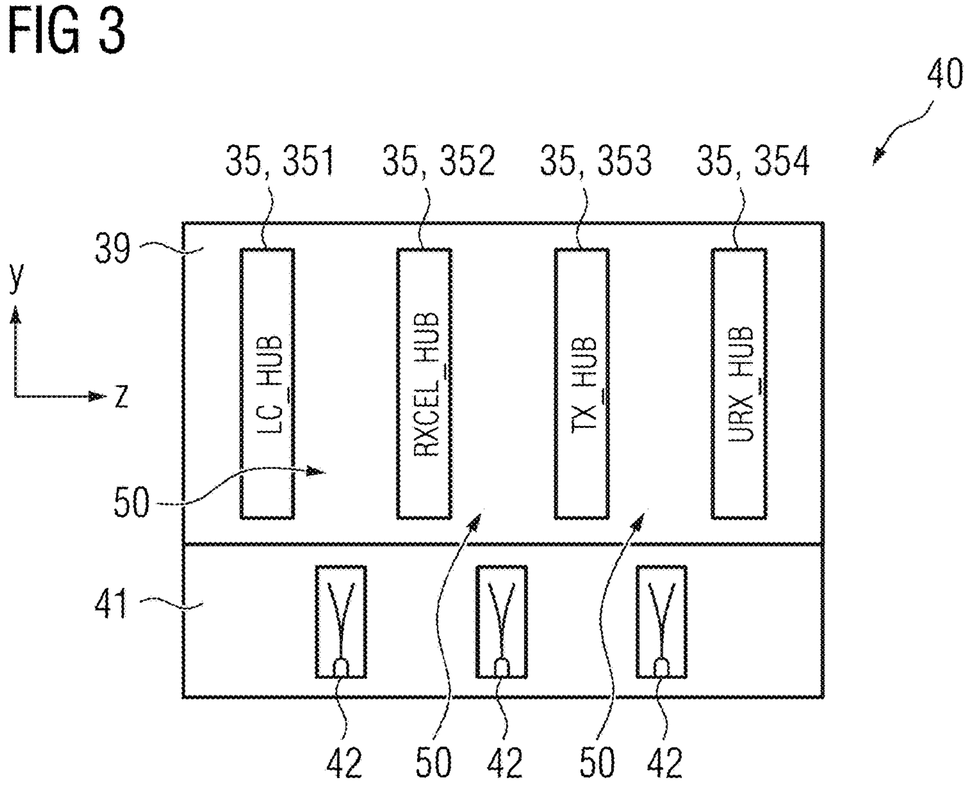
FIG. 3 illustrates a first embodiment of an example cooling apparatus in a first view according to the disclosure.

FIG. 3 illustrates a first embodiment of a cooling apparatus 40 in a first view in a schematic representation according to the disclosure. The cooling apparatus 40 comprises the control unit 39, wherein the control unit 39 comprises several electronic components 35, 351, 352, 353, 354, which generate waste heat during the operation of the magnetic resonance device 11. Examples of such electronic components 35 are the local coil distributor matrix 35, 351, the radio-frequency antenna receiving distributor 35, 352, the radio-frequency antenna transmitting distributor 35, 353, and the control matrix 35, 354.

The control unit 39 can be arranged on a surface of the detector unit 13 and comprises an active cooling unit 41. The active cooling unit 41 comprises several piezoelectric fans 42, which are designed to generate an airflow on the surface of the control unit 39, e.g. on the surfaces of the electronic components 35.

According to this embodiment, the electronic components 35 are arranged parallel to each other, wherein at least two of the electronic components 35 are spaced apart from each other by a gap 50 in each case, such that two adjacent electronic components 35 are separated from each other by the gap 50. The control unit 39 may comprise any suitable number of gaps 50, wherein the number of gaps 50 typically corresponds to the number of electronic components 35 included in the control unit 39, reduced by one.

The active cooling unit 41 is embodied to generate an airflow through at least one gap 50, and may for example generate an airflow through all gaps 50. The electronic components 35 may for example be embodied as surface elements in each case, so that these are to be arranged perpendicularly on the surface of the detector unit 13. In this arrangement, the longitudinal side of the electronic components 35, e.g. the surface elements, runs predominantly vertically, i.e. in the y-direction as shown. According to this embodiment, the gaps 50 also run in a vertical direction, i.e. in the y-direction.

In addition, according to this embodiment, the piezoelectric fans 42 included in the active cooling unit 41 are arranged in the vertical direction below the gaps 50 in such a way that the blowers 43 of the piezoelectric fans 42 face the electronic components 35. Exactly one piezoelectric fan 42, which generates an airflow in the gap 50 assigned to it, can be assigned to each gap 50.

Figure 4:
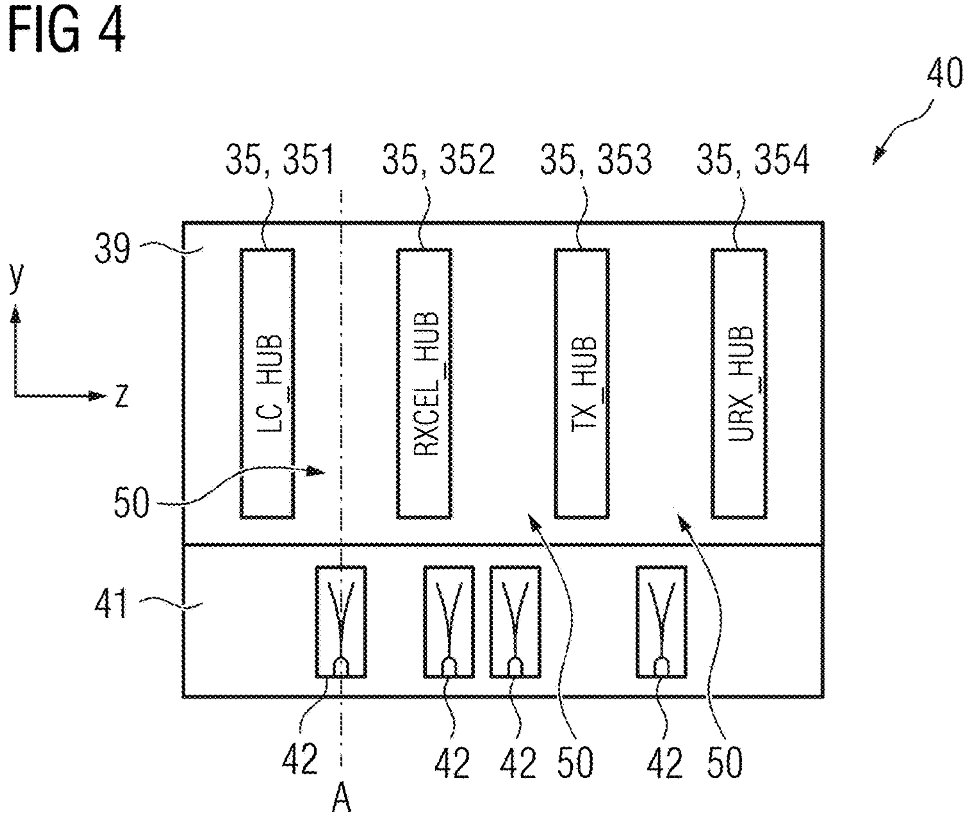
FIG. 4 illustrates a second embodiment of an example cooling apparatus in a first view according to the disclosure.

FIG. 4 illustrates a second embodiment of a cooling apparatus 40 in a first view in a schematic representation according to the disclosure. This differs from the embodiment shown in FIG. 3 in that two piezoelectric fans 42 are provided at an opening in a gap 50 and are jointly embodied to generate an airflow through the gap 50. The embodiment shows two piezoelectric fans 42 below the gap 50 between the two electronic components 352, 353, wherein a first electric fan 42 has a smaller distance to the electronic component 352 than to the electronic component 353, and a second electric fan 42 has a smaller distance to the electronic component 353 than to the electronic component 352.

Figure 5:
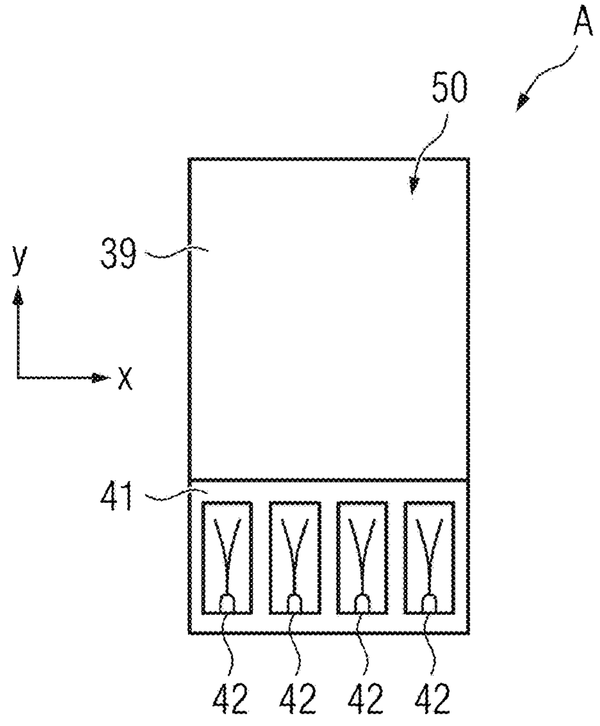
FIG. 5 illustrates a third embodiment of an example cooling apparatus in a second view according to the disclosure.

FIG. 5 illustrates a third embodiment of a cooling apparatus 40 in a second view in a schematic representation according to the disclosure. As an example, the third embodiment in the second view may represent a cross-sectional area along the line A as shown in FIG. 4. According to this embodiment, the active cooling unit 41 comprises several piezoelectric fans 42, which are jointly embodied to generate an airflow through the gap 50 between the electronic components 351, 352. The several piezoelectric fans 42 are arranged in such a way that they have equal distances from the electronic component 351 at the opening of gap 50. Likewise, the distances between the several piezoelectric fans 42 and the electronic component 352 may be the same in each case. If this embodiment of the cooling apparatus 40 is arranged on the surface of the detector unit 13, the several piezoelectric fans have a different distance from the surface of the detector unit 13.

Figure 6:
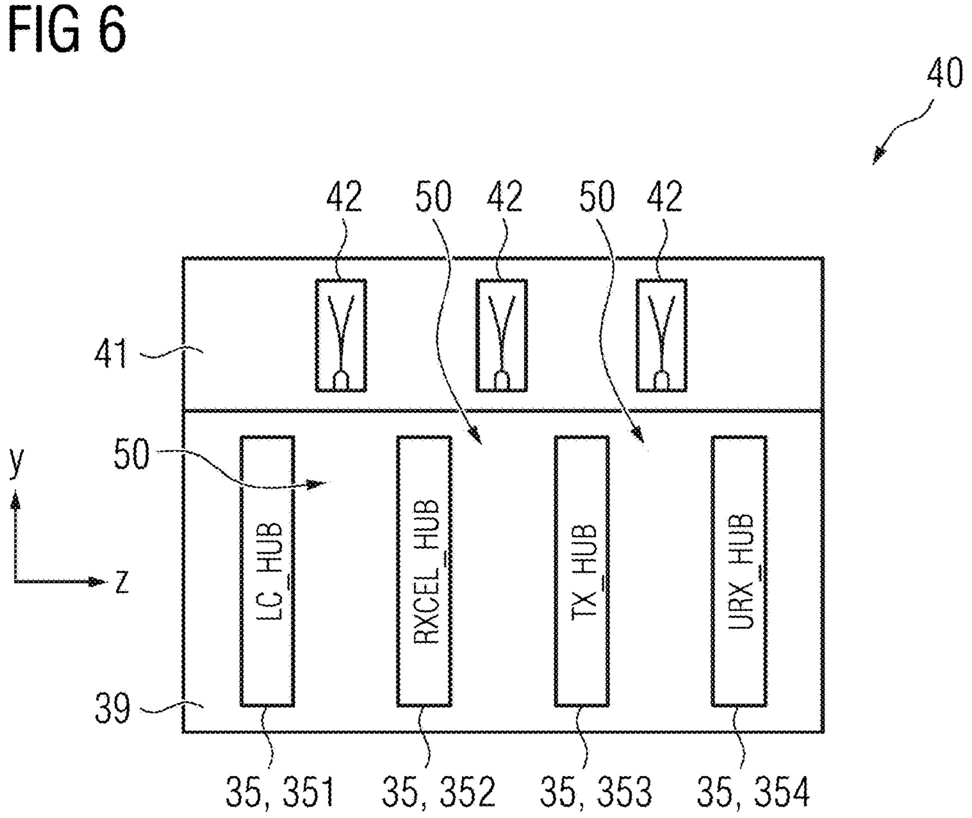
FIG. 6 illustrates a fourth embodiment of an example cooling apparatus in a first view according to the disclosure.

FIG. 6 illustrates a fourth embodiment of a cooling apparatus 40 in a first view in a schematic representation according to the disclosure. The several piezoelectric fans 42 are arranged according to this embodiment in the vertical direction, in other words in the y-direction, above the gaps 50, wherein the blowers included in the piezoelectric fans 42 face away from the electronic components 35.

Figure 7:
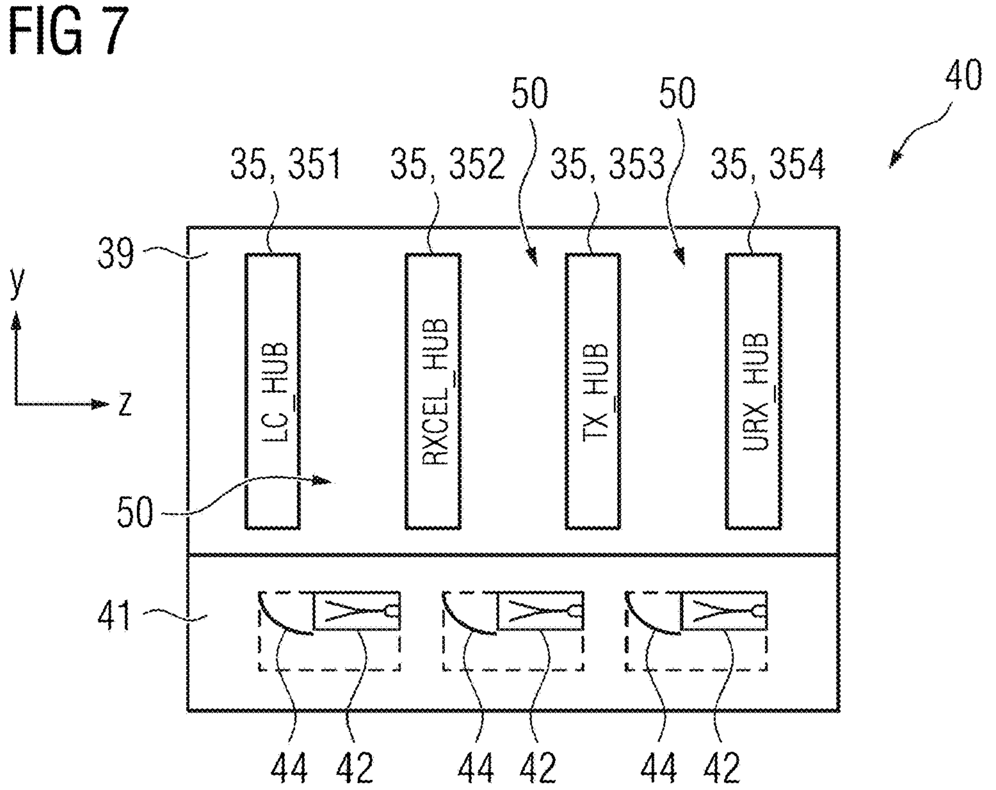
FIG. 7 illustrates a fifth embodiment of an example cooling apparatus in a first view according to the disclosure.

FIG. 7 illustrates a fifth embodiment of a cooling apparatus 40 in a first view in a schematic representation according to the disclosure. The fifth embodiment provides that the active cooling unit 41 comprises air deflection apparatuses 44. Here, the number of air deflection apparatuses 44 may for example correspond to the number of piezoelectric fans 42, which are arranged in the horizontal direction, i.e. in the x-direction. An air deflection apparatus 44, which is embodied to introduce the airflow in the vertical direction into the gap 50, is assigned to each piezoelectric fan 42 in the horizontal direction. At least one piezoelectric fan 42 may be arranged in a horizontal direction with air deflection apparatus 44 below each gap 50.

Figure 8:
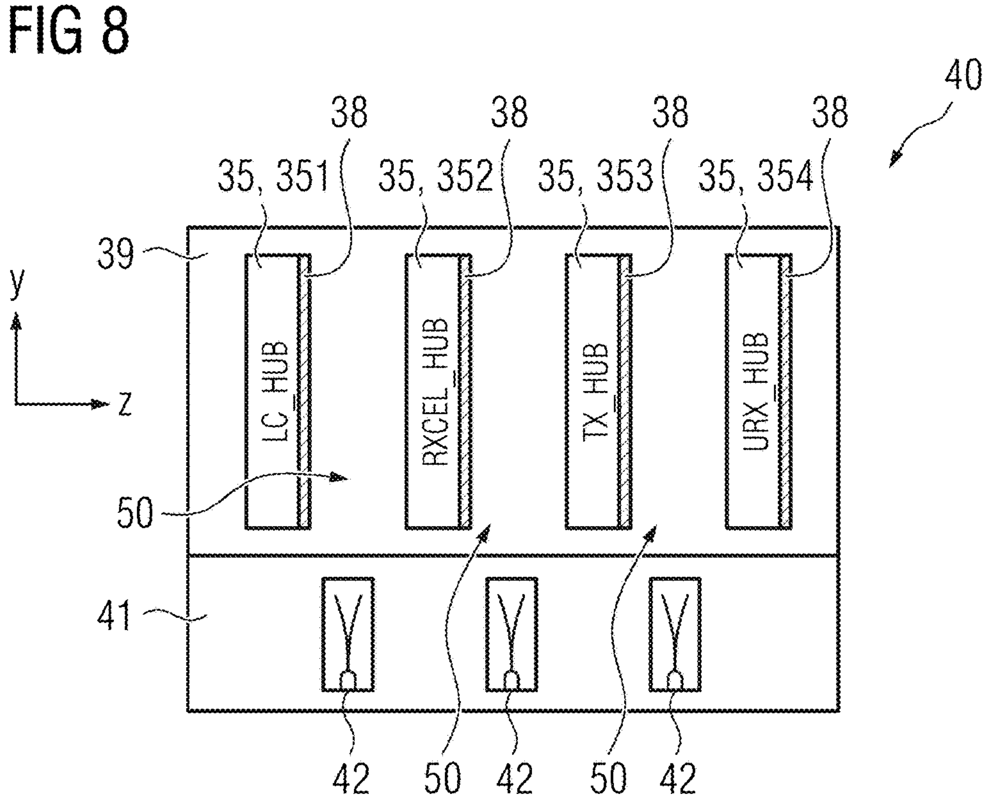
FIG. 8 illustrates a sixth embodiment of an example cooling apparatus in a first view according to the disclosure.

FIG. 8 illustrates a sixth embodiment of a cooling apparatus 40 in a first view in a schematic representation according to the disclosure. The electronic components 35, 351, 352, 353, 354 each have a heat surface 38 and are arranged in such a way that exactly one heat surface 38 faces a gap 50. The multiple piezoelectric fans 42 are designed to generate an airflow in each of the gaps 50.

Figure 9:
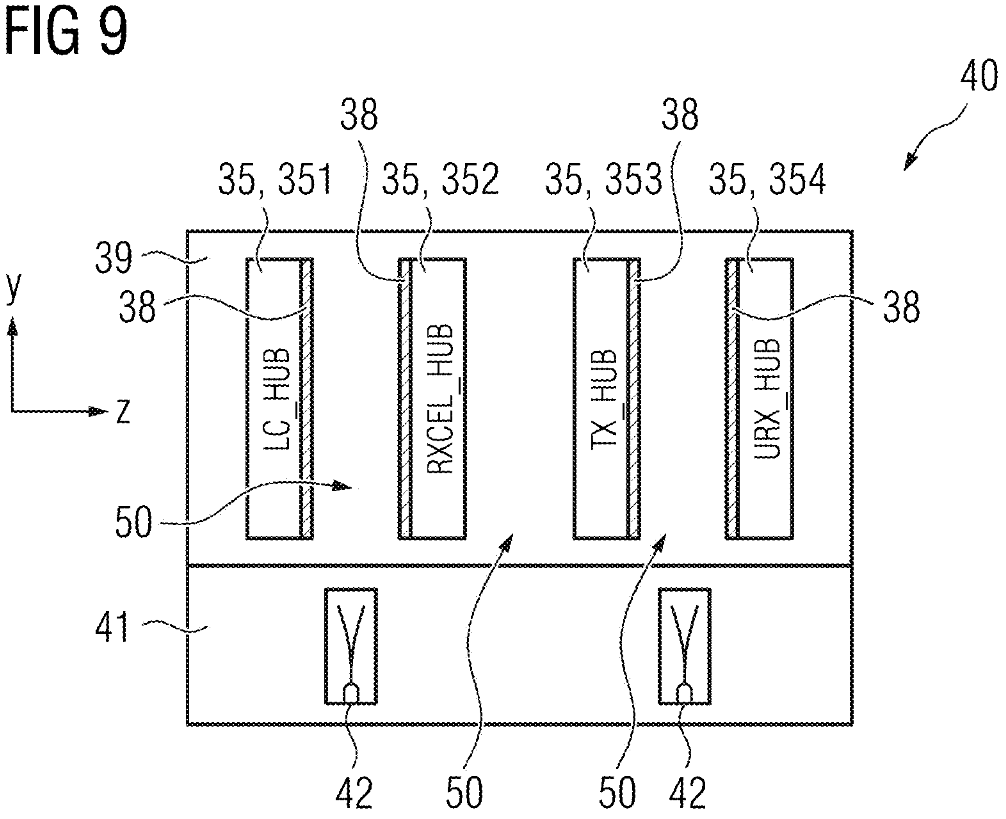
FIG. 9 illustrates a seventh embodiment of an example cooling apparatus in a first view according to the disclosure.

FIG. 9 illustrates a seventh embodiment of a cooling apparatus 40 in a first view in a schematic representation according to the disclosure. The electronic components 35, 351, 352, 353, 354 each have a heat surface 38 and are arranged in such a way that two heat surfaces 38 face a gap 50 in each case. This applies, for example, to the gap 50 between the adjacent electronic components 351, 352 and the gap 50 between the adjacent electronic components 353, 354.

The cooling apparatus 40 comprises at least two piezoelectric fans 42, which generate an airflow in the gaps 50 between the electronic components 351, 352 and between the electronic components 353, 354.

According to this embodiment, a gap 50 between two adjacent electronic components 352, 353 is free of a heat surface 38 facing the gap 50. This gap 50 may for instance be free of a piezoelectric fan 42 assigned to the gap 50. By way of example, FIG. 9 shows a control unit 39 with four electronic components 35, 351, 352, 353, 354 and three gaps 50, wherein two of the four electronic components 35, 351, 352, 353, 354 are arranged next to each other and are spaced apart from each other by a gap 50 of the three gaps 50 in each case. The active cooling unit 41 is embodied to generate an airflow through at least two gaps 50. The four electronic components 35, 351, 352, 353, 354 each have a heat surface 38 and are arranged in such a way that at least one gap 50 of the three gaps 50 is free of a facing heat surface 38.

Figure 10:
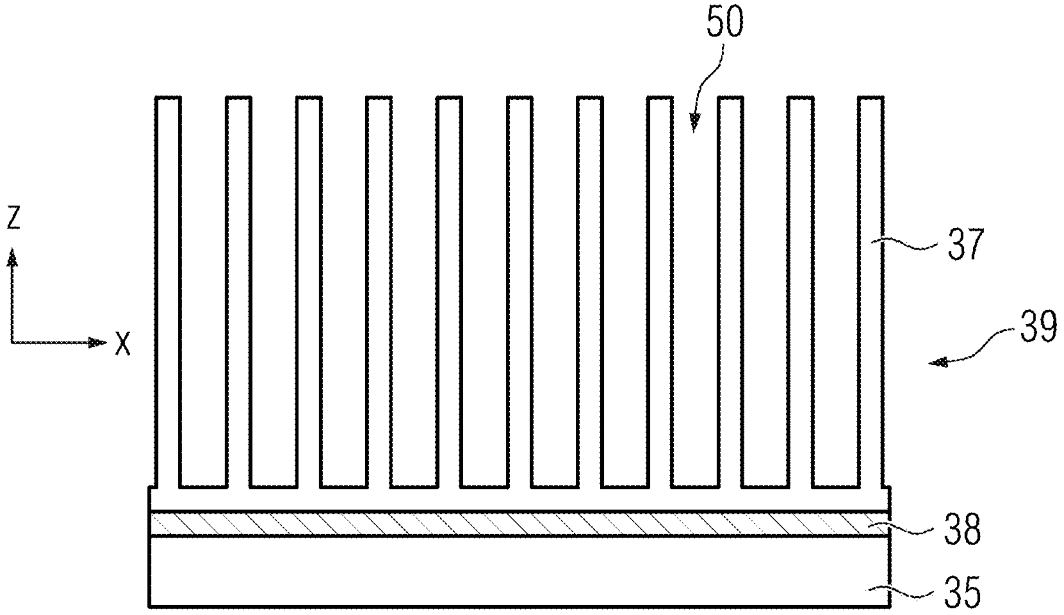
FIG. 10 illustrates an eighth embodiment of an example cooling apparatus in a third view according to the disclosure.

FIG. 10 illustrates an eighth embodiment of a cooling apparatus 40 in a third view in a schematic representation according to the disclosure. The third view may be perpendicular to the first view and perpendicular to the second view. This embodiment additionally comprises a passive cooling unit with a cooling body 39, which is arranged on a surface of an electronic component 35. The cooling body 39 has a number of fins 37 parallel to one another in the form of elevations at a right angle to the surface of the electronic component 35. The active cooling unit 41 is embodied to generate an airflow along the fins 37.

Figure 11:
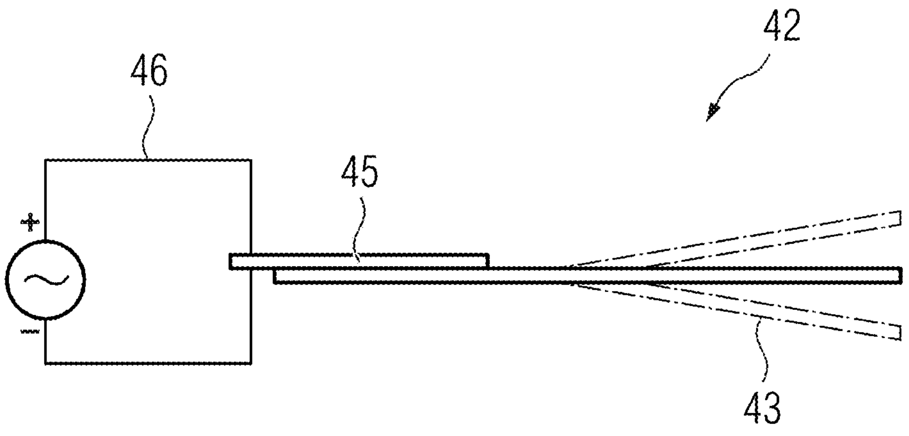
FIG. 11 illustrates an embodiment of an example piezoelectric fan according to the disclosure.

FIG. 11 illustrates a first embodiment of a piezoelectric fan 42 in a schematic representation. The piezoelectric fan 42 comprises a piezo unit 45, a blower 43, and a piezo control unit 46. The piezo control unit 46 comprises a voltage source and is embodied to supply the piezo unit 45 with an electrical voltage. The voltage source may for instance embodied to generate any suitable voltage, such as at least 10V, at least 20V, etc. The piezo unit 45 is connected to the blower 43 in such a way that a vibration from the piezo unit 45 is transmitted to the blower 43, which thereby generates an airflow.

With respect to the various x, y, and z-directions, it is noted that the z-direction may be defined as parallel to the bore of the main magnet 17, e.g. aligned with a direction in which the positioning apparatus 16 moves to move the patient into and out of the patient receiving area 14. The x- and y-directions are both perpendicular to this z-direction, as noted herein.

Although the disclosure has been illustrated and described in detail by way of the preferred exemplary embodiments, the disclosure is not restricted by the examples given and other variations can be derived therefrom by a person skilled in the art without departing from the protective scope of the disclosure.

Independent of the grammatical term usage, individuals with male, female or other gender identities are included within the term.

The various components described herein may be referred to as "units." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units or subunits, as applicable and relevant, may alternatively be referred to herein as "circuitry," "controllers," "processors," or "processing circuitry," or alternatively as noted herein.

What is claimed is:

1. A cooling apparatus, comprising:
   a control unit for a detector of a magnetic resonance device, the detector including a main magnet of the magnetic resonance device, and the control unit comprising at least two electronic components that generate heat during operation of the magnetic resonance device,
   wherein the control unit is configured to be arranged on a surface of the detector; and
   an active cooling unit comprising at least one piezoelectric fan,
   wherein the at least one piezoelectric fan is configured to direct an airflow on a surface of the control unit and/or on a surface of at least one of the at least two electronic components.

2. A magnetic resonance device, comprising:
   a detector including a main magnet of the magnetic resonance device; and
   a cooling apparatus for a control unit of the magnetic resonance device, wherein the cooling apparatus comprises:
      at least two electronic components that generate heat during operation of the magnetic resonance device,
      wherein the control unit is configured to be arranged on a surface of the detector; and
      an active cooling unit comprising at least one piezoelectric fan, and
      wherein the at least one piezoelectric fan is configured to direct an airflow on a surface of the control unit and/or on a surface of at least one of the at least two electronic components.

3. The cooling apparatus as claimed in claim 1, wherein the at least two electronic components of the control unit are arranged next to each other and spaced apart from one another via a gap, and wherein the active cooling unit is configured to direct the airflow through the gap.

4. The cooling apparatus as claimed in claim 1, wherein: the control unit comprises at least four electronic components and at least three gaps, two of the at least four electronic components are arranged next to each other and spaced apart from one another by a gap in each of the at least three gaps, the active cooling unit is configured to generate an airflow through at least one of the at least three gaps, and each of the at least four electronic components has a heat surface and is arranged such that at least one of the at least three gaps is free of a facing heat surface and is free of a piezoelectric fan assigned to the gap.

5. The cooling apparatus as claimed in claim 1, wherein: the at least two electronic components each comprise surface elements arranged parallel to each other and spaced apart from each other by a gap, and the control unit is configured to be arranged on the surface of the detector want such that flat surfaces of the surface elements of the at least two electronic components are arranged perpendicular to a surface of the detector.

6. The cooling apparatus as claimed in claim 1, further comprising:

a passive cooling unit comprising a cooling element arranged on a surface of one of the at least two electronic components.

7. The cooling apparatus as claimed in claim 1, wherein the at least one piezoelectric fan functions independently of a magnetic field generated by the main magnet of the magnetic resonance device.

8. The cooling apparatus as claimed in claim 1, wherein the active cooling unit is free of a liquid cooling medium.

9. The cooling apparatus as claimed in claim 1, wherein, when the control unit is arranged on the surface of the detector, a longitudinal side of the at least one electronic component and a gap between the at least two electronic components run predominantly in a vertical direction.

10. The cooling apparatus as claimed in claim 3, wherein: the active cooling unit comprises at least two piezoelectric fans that are configured to direct an airflow through the gap, the at least two piezoelectric fans are arranged at an opening in the gap at equal distances from at least one of the at least two electronic components and spaced apart from one another by the gap, and when the cooling apparatus is arranged on the surface of the detector, the at least two piezoelectric fans are each disposed a different distance from the surface of the detector.

11. The cooling apparatus as claimed in claim 3, wherein: the active cooling unit comprises at least two piezoelectric fans that are configured to direct an airflow through the gap, the at least two piezoelectric fans are arranged at an opening of the gap with different distances from the at least one of the at least two electronic component and spaced apart from one another by the gap, and when the cooling apparatus is arranged on the surface of the detector, the at least two piezoelectric fans are each disposed an identical distance from the surface of the detector.

12. The cooling apparatus as claimed in claim 3, wherein, when the control unit is arranged on the surface of the detector, a longitudinal side of the at least one electronic component and the gap run predominantly in a vertical direction, and wherein the vertical direction is with respect to the magnetic resonance device and is perpendicular to a direction in which a patient is moved into and out of a patient receiving area of the magnetic resonance device.

13. The cooling apparatus as claimed in claim 3, wherein each of the at least two electronic components has a heat surface, and are arranged such that one heat surface per respective one of the at least two electronic components faces the gap, and wherein the at least one piezoelectric fan is configured to direct the airflow through the gap.

14. The cooling apparatus as claimed in claim 3, wherein each one of the at least two electronic components comprises a heat surface, and are arranged such that respective heat surfaces of the at least two electronic components face the gap, and wherein the at least one piezoelectric fan is configured to direct the airflow through the gap.

15. The cooling apparatus as claimed in claim 6, wherein the cooling element comprises a plurality of fins parallel to one another in a form of elevations perpendicular to a surface of the at least two electronic components, and wherein the active cooling unit is configured to direct an airflow along the fins.

16. The cooling apparatus as claimed in claim 9, wherein the vertical direction is with respect to the magnetic resonance device and is perpendicular to a direction in which a patient is moved into and out of a patient receiving area of the magnetic resonance device.

17. The cooling apparatus as claimed in claim 9, wherein the at least one piezoelectric fan is arranged in the vertical direction below the gap, and wherein a blower included in the at least one piezoelectric fan faces the at least two electronic components.

18. The cooling apparatus as claimed in claim 12, wherein the at least one piezoelectric fan is arranged in the vertical direction below the gap, and wherein a blower included in the at least one piezoelectric fan faces the at least two electronic components.

19. The cooling apparatus as claimed in claim 12, wherein the at least one piezoelectric fan is arranged in the vertical direction above the gap, and wherein a blower included in the at least one piezoelectric fan faces away from the at least two electronic components.

20. The cooling apparatus as claimed in claim 12, wherein:

the active cooling unit comprises an air deflector, the at least one piezoelectric fan is arranged in a horizontal direction that is perpendicular to the vertical direction, and the air deflector is configured to introduce and/or discharge an airflow in the vertical direction into and/or away from the gap.

* * * * *